United States Patent
Brown et al.

(10) Patent No.: US 7,697,260 B2
(45) Date of Patent: *Apr. 13, 2010

(54) DETACHABLE ELECTROSTATIC CHUCK

(75) Inventors: Karl Brown, Mountain View, CA (US); Nora Arellano, Macomb, MI (US); Semyon Sherstinsky, San Francisco, CA (US); Allen Lau, Cupertino, CA (US); Cheng-Hsiung Tsai, Cupertino, CA (US); Vineet Mehta, Sunnyvale, CA (US); Steve Sansoni, Livermore, CA (US); Wei W. Wang, Santa Clara, CA (US)

(73) Assignee: Applied Materials, Inc., Santa Clara, CA (US)

( * ) Notice: Subject to any disclaimer, the term of this patent is extended or adjusted under 35 U.S.C. 154(b) by 673 days.

This patent is subject to a terminal disclaimer.

(21) Appl. No.: 10/816,152

(22) Filed: Mar. 31, 2004

(65) Prior Publication Data

US 2005/0219786 A1    Oct. 6, 2005

(51) Int. Cl.
*H01L 21/683* (2006.01)
*H01T 23/00* (2006.01)
*B23B 31/28* (2006.01)

(52) U.S. Cl. ..................... 361/234; 279/128

(58) Field of Classification Search ......... 361/230–234, 361/220, 56, 212; 279/128
See application file for complete search history.

(56) References Cited

U.S. PATENT DOCUMENTS

| | | | |
|---|---|---|---|
| 3,586,343 A | 6/1971 | Reed | |
| 4,090,851 A | 5/1978 | Berkman et al. | |
| 4,180,723 A | 12/1979 | Szupillo | |
| 4,184,188 A | 1/1980 | Briglia et al. | |
| 4,384,918 A | 5/1983 | Abe | |
| 4,645,218 A | 2/1987 | Ooshio et al. | |
| 4,902,025 A | 2/1990 | Zimdars | |

(Continued)

FOREIGN PATENT DOCUMENTS

EP    0 123 456 A2    10/1984

(Continued)

OTHER PUBLICATIONS

Office Action dated Mar. 9, 2007, U.S. Appl. No. 11/221,169 entitled "Detachable electrostatic chuck for supporting a substrate in a process chamber" (US).

(Continued)

*Primary Examiner*—Fritz M. Fleming
*Assistant Examiner*—Lucy Thomas
(74) *Attorney, Agent, or Firm*—Janah & Associates, P.C.

(57) ABSTRACT

An electrostatic chuck is capable of attachment to a pedestal in a process chamber. The chuck has an electrostatic puck comprises a ceramic body with an embedded electrode. The ceramic body has a substrate support surface with an annular periphery. The chuck also has a base plate below the electrostatic puck that is a composite of a ceramic material and a metal. The base plate has an annular flange extending beyond the periphery of the ceramic body. The base plate and electrostatic puck can be supported by a support pedestal having a housing and an annular ledge that extends outwardly from the housing to attach to the annular flange of the base plate. A heat transfer plate having an embedded heat transfer fluid channel can also be provided.

19 Claims, 3 Drawing Sheets

U.S. PATENT DOCUMENTS

| | | | |
|---|---|---|---|
| 5,155,652 | A | 10/1992 | Logan et al. |
| 5,191,506 | A | 3/1993 | Logan et al. |
| 5,213,349 | A | 5/1993 | Elliott |
| 5,280,156 | A | 1/1994 | Niori et al. |
| 5,376,213 | A | 12/1994 | Ueda et al. |
| 5,460,684 | A | 10/1995 | Saeki et al. |
| 5,478,429 | A | 12/1995 | Komino et al. |
| 5,527,584 | A | 6/1996 | Darfler et al. |
| 5,529,657 | A | 6/1996 | Ishii |
| 5,581,874 | A | 12/1996 | Aoki et al. |
| 5,600,530 | A | 2/1997 | Smith |
| 5,606,484 | A | 2/1997 | Kawada et al. |
| 5,625,526 | A | 4/1997 | Watanabe et al. |
| 5,665,260 | A | 9/1997 | Kawada et al. |
| 5,671,116 | A | 9/1997 | Husain |
| 5,720,818 | A | 2/1998 | Donde et al. |
| 5,729,423 | A | 3/1998 | Donde et al. |
| 5,737,178 | A | 4/1998 | Herchen |
| 5,745,331 | A | 4/1998 | Shamouilian et al. |
| 5,796,074 | A * | 8/1998 | Edelstein et al. .......... 219/390 |
| 5,818,693 | A | 10/1998 | Garner et al. |
| 5,822,171 | A | 10/1998 | Shamouilian et al. |
| 5,827,585 | A | 10/1998 | Giannetti |
| 5,844,205 | A | 12/1998 | White et al. |
| 5,851,298 | A | 12/1998 | Ishii |
| 5,858,100 | A | 1/1999 | Maeda et al. |
| 5,870,100 | A | 2/1999 | DeFreitas |
| 5,879,100 | A | 3/1999 | Winkler |
| 5,886,863 | A | 3/1999 | Nagasaki et al. |
| 5,886,864 | A | 3/1999 | Dvorsky |
| 5,903,428 | A | 5/1999 | Grimard et al. |
| 5,906,684 | A | 5/1999 | Tamura et al. |
| 5,916,370 | A | 6/1999 | Chang |
| 5,949,650 | A | 9/1999 | Bulante et al. |
| 5,958,813 | A | 9/1999 | Aida et al. |
| 5,978,202 | A | 11/1999 | Wadensweiler et al. |
| 5,986,747 | A | 11/1999 | Moran |
| 5,986,875 | A | 11/1999 | Donde et al. |
| 5,994,662 | A | 11/1999 | Murugesh |
| 6,009,831 | A | 1/2000 | Hwang |
| 6,034,863 | A | 3/2000 | Marohl et al. |
| 6,046,758 | A | 4/2000 | Brown et al. |
| 6,048,434 | A | 4/2000 | Tamura et al. |
| 6,072,685 | A | 6/2000 | Herchen et al. |
| 6,074,512 | A | 6/2000 | Collins et al. |
| 6,081,414 | A * | 6/2000 | Flanigan et al. .......... 361/234 |
| 6,094,334 | A | 7/2000 | Bedi et al. |
| 6,108,189 | A * | 8/2000 | Weldon et al. .......... 361/234 |
| 6,120,661 | A | 9/2000 | Hirano et al. |
| 6,159,055 | A | 12/2000 | Satitpunwaycha et al. |
| 6,181,049 | B1 | 1/2001 | Streckert et al. |
| 6,215,641 | B1 | 4/2001 | Busse et al. |
| 6,219,219 | B1 | 4/2001 | Hausmann et al. |
| 6,310,755 | B1 | 10/2001 | Kholodenko et al. |
| 6,376,808 | B2 | 4/2002 | Tachikawa et al. |
| 6,423,949 | B1 | 7/2002 | Chen et al. |
| 6,462,928 | B1 | 10/2002 | Shamouilian et al. |
| 6,469,283 | B1 | 10/2002 | Burkhart et al. |
| 6,490,144 | B1 | 12/2002 | Narendrnath et al. |
| 6,490,146 | B2 | 12/2002 | Wang et al. |
| 6,503,131 | B1 | 1/2003 | Franklin et al. |
| 6,503,368 | B1 | 1/2003 | Kholodenko |
| 6,503,572 | B1 * | 1/2003 | Waggoner et al. .......... 427/431 |
| 6,506,291 | B2 | 1/2003 | Tsai et al. |
| 6,538,872 | B1 * | 3/2003 | Wang et al. .......... 361/234 |
| 6,563,686 | B2 | 5/2003 | Tsai et al. |
| 6,583,980 | B1 | 6/2003 | Wang et al. |
| 6,630,413 | B2 | 10/2003 | Todd |
| 6,646,233 | B2 | 11/2003 | Kanno et al. |
| 6,700,099 | B2 * | 3/2004 | Cole et al. .......... 219/444.1 |
| 2001/0012604 | A1 | 8/2001 | Okase et al. |
| 2002/0036881 | A1 | 3/2002 | Shamouilian et al. |
| 2002/0050246 | A1 | 5/2002 | Parkhe et al. |
| 2002/0075624 | A1 | 6/2002 | Wang et al. |
| 2002/0081445 | A1 | 6/2002 | Kadomura et al. |
| 2003/0010292 | A1 | 1/2003 | Kholodenko et al. |
| 2005/0194374 | A1 | 9/2005 | Gelatos et al. |

FOREIGN PATENT DOCUMENTS

| | | |
|---|---|---|
| EP | 0 790 641 A | 8/1997 |
| JP | 04-238882 | 8/1992 |
| JP | 09045757 A | 2/1997 |
| JP | 10270540 A | 10/1998 |
| JP | 11163109 A | 6/1999 |
| JP | 11176919 A | 7/1999 |
| WO | WO-99/25006 A2 | 5/1999 |
| WO | WO-2008/048518 A1 | 4/2008 |

OTHER PUBLICATIONS

Office Action dated Oct. 9, 2007, U.S. Appl. No. 11/221,169 entitled "Detachable electrostatic chuck for supporting a substrate in a process chamber" (US).

Final Office Action dated May 29, 2008, U.S. Appl. No. 11/221,169 entitled "Detachable electrostatic chuck for supporting a substrate in a process chamber" (US).

Office Action dated Nov. 4, 2005, Chinese Patent Application No. 200420115729.5 entitled "Detachable electrostatic chuck", (China).

M Cubed Technologies, Inc., "Beams and Structural Members", Beam Note, Rev. 03, Jul. 25, 2001, retrieved at Internet address www.mmmt.com/Beam.pdf.

M Cubed Technologies, Inc., "Si Wafer Chucks", retrieved at Internet address www.mmmt.com/chuck.pdf, Nov. 16, 2003.

M Cubed Technologies, Inc., "Overview of M Cubed Technologies' Materials Processes", Materials Overview, Rev. 02, 080403, retrieved at Internet address www.mmmt.com/Technotes/MaterialsOverview.pdf, Dec. 6, 2003.

M Cubed Technologies, Inc., "Preform Infiltrated Silicon Carbide Particulate-Reinforced Aluminum (AlSiC) Metal Matrix Composites", Infiltrated MMC, Rev. 01, Nov. 2, 1999, retrived at Internet address www.mmmt.com/Technotes/InfilMMCNote.pdf.

M Cubed Technologies, Inc., "Cast Silicon Carbide Particulate-Reinforced Aluminum (Al/SiC) Metal Matrix Composites", Cast MMC, Rev. 02, May 8, 2001, retrived at Internet address www.mmmt.com/Technotes/CastMMCNote.pdf.

M Cubed Technologies, Inc., "Reaction Bonded Silicon Carbide Ceramics", Reaction Bonded SiC, Rev. 02, Nov. 18, 1999, retrived at Internet address www.mmmt.com/Technotes/SiCNote.pdf.

M Cubed Technologies, Inc., "Aluminum-Toughened SiC Ceramic", Al-Toughened SiC, Rev. 05, Aug. 4, 2003, retrived at Internet address www.mmmt.com/Technotes/ToughenedSiCNote.pdf.

Karandikar et al, "Complex, net-shape ceramic composite components for structural, lithography, mirror and armor applications", Presented at the 27th Annual Cocoa Beach Conference and Exposition, Cocoa Beach, FL, 2003 by M Cubed Technologies, Inc., retrived at Internet address www.mmmt.com/Publications/MCubedCocoaBeach03.pdf, Aug. 2003.

IBM Technical Disclosure Bulletin, vol. 31, No. 1, Jun. 1988, pp. 462-464.

U.S. Appl. No. 11/549,594, filed Oct. 13, 2006, Vijay D. Parkhe et al.
U.S. Appl. No. 11/221,169, filed Sep. 7, 2005, Karl Brown et al.

* cited by examiner

DETACHABLE ELECTROSTATIC CHUCK

BACKGROUND

Embodiments of the present invention relate to an electrostatic chuck for holding a substrate in a process chamber In the processing of substrates, such as semiconducting wafers and displays, the substrate is placed on a support in a process chamber and suitable processing conditions are maintained in the chamber. The support can include an electrostatic chuck that has an electrode capable of being electrically biased to hold the substrate on the support. The electrode may also be electrically biased, for example with an RF bias power, to energize a process gas in the chamber to process the substrate. The support can also comprise a pedestal that supports the electrostatic chuck in the chamber, and may be capable of raising or lowering the height of the electrostatic chuck and substrate. The pedestal can also provide a protective enclosure for connecting wires, gas tubes etc, that connect to portions of the support.

In a typical chamber process, energized gases are used to process substrates by, for example, etching or depositing material on the substrate, or to clean surfaces in the chamber. These energized gases can comprise highly corrosive species, such as chemical etchants, as well as energized ionic and radical species that can erode away portions of the support, such as an electrostatic chuck composed of aluminum nitride. The eroded support can be problematic because the damaged support may not provide the desired electrical characteristics for processing substrates or holding substrates on the support. Also, particles that have eroded from the support can contaminate substrates being held on the support.

An example of a conventional support having improved resistance to erosion comprises an electrostatic chuck made of a ceramic, such as aluminum nitride, and having an embedded electrode that is brazed to an underlying stainless steel pedestal, as described in U.S. Pat. No. 6,563,686 to Tsai et al, filed on Mar. 19, 2001 and commonly assigned to Applied Materials, which is herein incorporated by reference in its entirety. Electrostatic chucks made of ceramics are desirable because they have improved resistance to corrosion by energized process gases, and can maintain their structural integrity even at high substrate processing temperatures exceeding several hundred degrees centigrade. However, a problem with conventional supports is that thermal expansion mismatch can occur between the ceramic electrostatic chuck and the supporting pedestal, especially during substrate processes conducted at high temperatures. The difference in thermal expansion coefficients of ceramic materials and the metal pedestal materials can result in thermal and mechanical stresses that can cause the ceramic to fracture or chip.

One solution to the thermal expansion mismatch problem is described in U.S. Pat. No. 6,490,146, entitled "Electrostatic chuck bonded to base with a bond layer and method", to Shamouilian et al, filed on May 7, 1999, and commonly assigned to Applied Materials, Inc, which is herein incorporated by reference in its entirety. The support described by Shamouilian et al. has a ceramic electrostatic member having an electrode that is attached to a base beneath the electrostatic member. The base is made of a composite of a ceramic and a metal that has a coefficient of thermal expansion that is sufficiently close to that of the electrostatic member to reduce thermal expansion stresses, for example, a difference of less than 10%. The ceramic electrostatic member and base are typically brazed together to provide a strong bond between the electrostatic member and base. The base can be secured in the chamber by attaching the base to an underlying support via a metal bond layer.

However, even these advanced substrate supports can eventually require replacement or refurbishment when they erode or have accumulated process deposits that require extensive cleaning after exposure to multiple plasma processing cycles. Sometimes, the entire support has to be replaced, so that a substrate will not become contaminated by flaked particles of process residue or that arise from damaged portions of support, and to ensure that the desired electrical properties of the support are maintained consistent. The replacement of the entire support can be both costly and wasteful. For example, a replacement substrate support can cost tens of thousands of U.S. dollars, and the support may need to be replaced, on average, after the processing of 50,000 to 100,000 substrates, increasing processing costs. The support may also need to be replaced if misuse or accidental operation damages the support surface or edges.

Thus, it is desirable to have a substrate support that exhibits reduced thermal expansion mismatch problems. It is furthermore desirable to have a substrate support that does not require replacement of the entire support as frequently as conventional supports. It is also desirable to have a substrate support that does not incur replacement costs that are as high as those of conventional supports.

SUMMARY

An electrostatic chuck is capable of attachment to a pedestal in a process chamber. The chuck has an electrostatic puck comprising a ceramic body with an embedded electrode. The ceramic body has a substrate support surface with an annular periphery. A base plate below the electrostatic puck comprises a composite of a ceramic material and a metal, and has an annular flange extending beyond the periphery of the ceramic body. The annular flange extension allows the chuck to be more easily attached and removed from the chamber.

In one version, the base plate is a composite that is a ceramic infiltrated with a metal, and has an annular flange with a plurality of holes that are shaped and sized to allow connectors to pass therethrough. The chuck has a support pedestal having a housing and an annular ledge that extends outwardly from the housing. The annular ledge is capable of being attached to the annular flange of the base plate by the connectors.

In yet another version, the electrostatic chuck has a heat transfer plate below the base plate that is at least partially surrounded by the pedestal housing. The heat transfer plate has an embedded heat transfer fluid channel. The chuck also has a spring assembly at least partially surrounded by the housing that can be biased to press the heat transfer plate against the base plate.

DRAWINGS

These features, aspects, and advantages of the present invention will become better understood with regard to the following description, appended claims, and accompanying drawings, which illustrate examples of the invention. However, it is to be understood that each of the features can be used in the invention in general, not merely in the context of the particular drawings, and the invention includes any combination of these features, where:

DESCRIPTION

Figure 1:
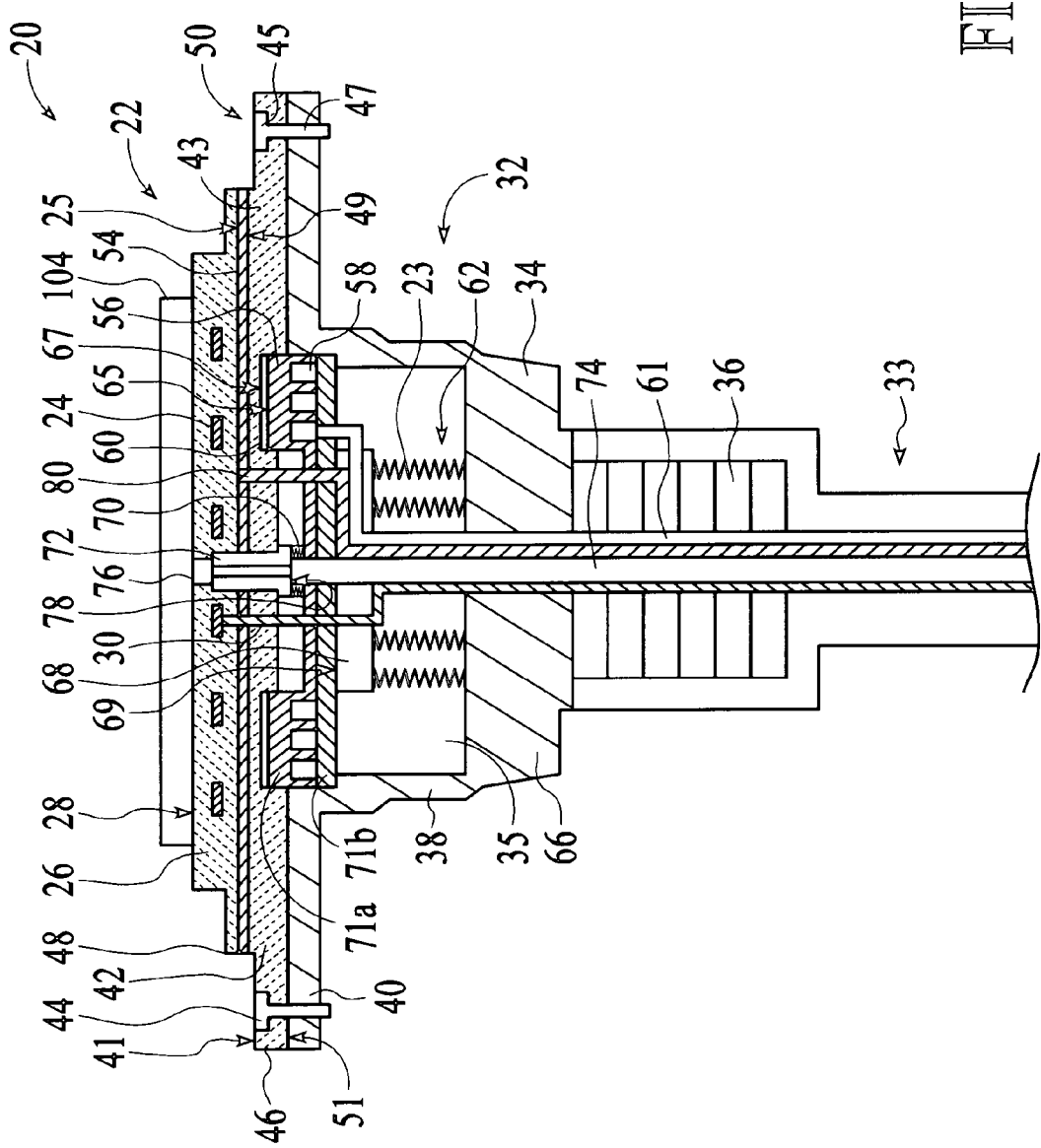
FIG. 1 is a sectional side view of an embodiment of an electrostatic chuck comprising a base plate with an annular flange attached to a pedestal ledge.
Figure 3:
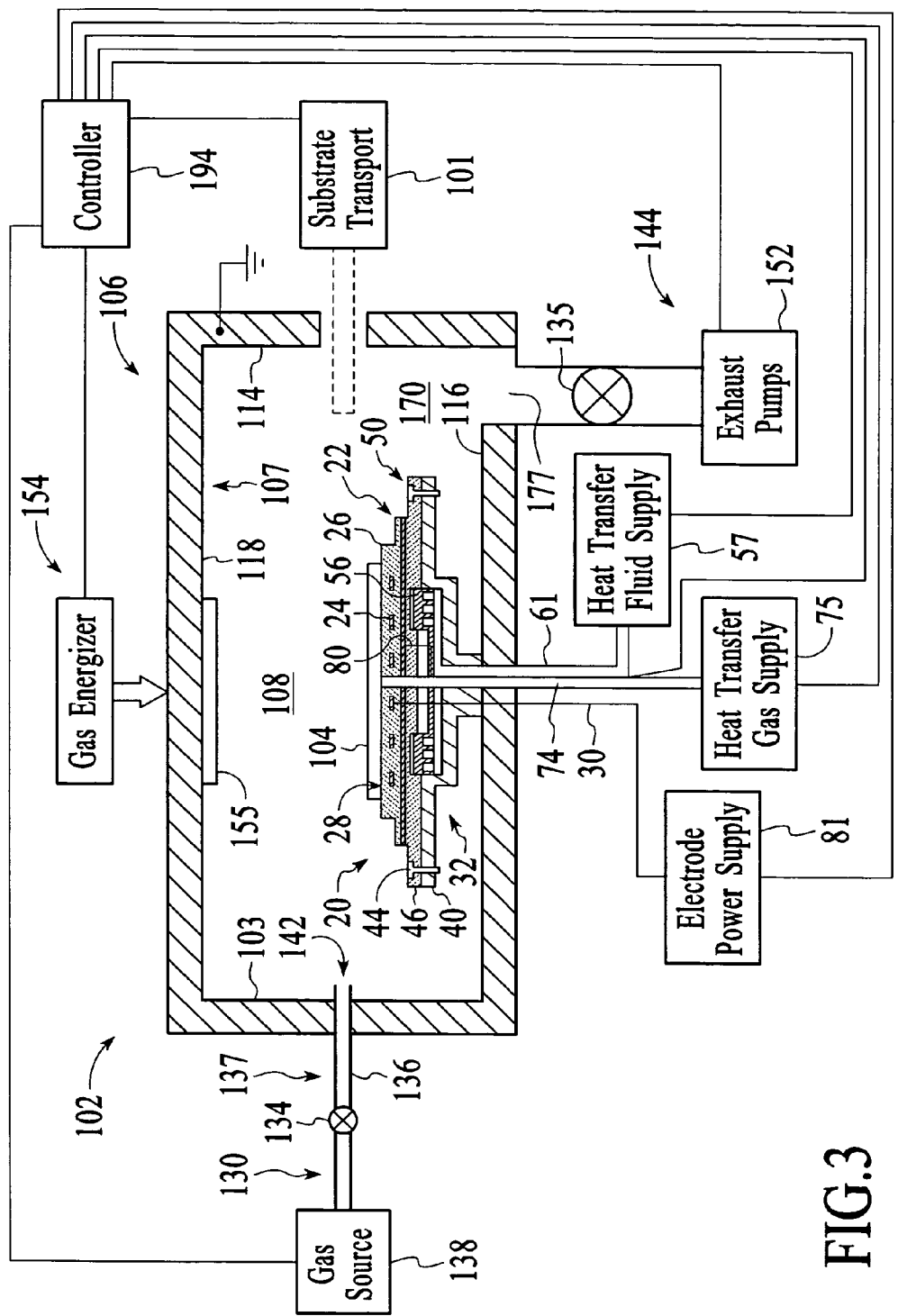
FIG. 3 is a partial sectional schematic side view of a version of a chamber having the electrostatic chuck.

An electrostatic chuck 20 comprises an electrostatic puck 22 having a chargeable electrode 24 that can electrostatically hold a substrate 104 in a substrate processing chamber 106, as illustrated in the exemplary chamber embodiment of FIG. 1. The electrostatic puck 22 comprises a ceramic body 26 having an electrode 24 embedded therein. The ceramic body 26 comprises a substrate support surface 28 that holds the substrate 104 on the chuck 20, and can comprise a disc-like shape with an annular periphery 48. The electrode 24 is capable of being electrically biased to electrostatically hold the substrate 104 on the surface 28. For example, the electrode 24 can be connected via an electrical connector 30 to an electrode power supply 81 that delivers a DC chucking voltage, as shown in FIG. 3. The electrode 24 may also be capable of being electrically biased to energize a process gas in the chamber to process the substrate 104 or clean the chamber 106. For example, the electrode power supply 81 may be capable of providing an RF bias to the electrode 24 to capacitively couple energy to a process gas. The ceramic body 26 desirably comprises a material that is permeable to electromagnetic energy, such as for example at least one of aluminum nitride, aluminum oxide, and titanium oxide, and preferably comprises aluminum nitride.

The electrostatic chuck 20 can further comprise a pedestal 32 to support the electrostatic puck 22 and substrate 104 in the chamber 106. The pedestal 32 comprises a housing 34 to protect portions of the electrostatic chuck 20 from the process environment. The housing 34 comprises sidewalls 38 and a bottom wall 66 that surround an interior enclosure 35 to protect components within the enclosure, such as for example electrical connectors, gas tubes and fluid conduits. The pedestal 32 further comprises a ledge 40 that extends outwardly from the top of the housing sidewall 38 to provide a projecting support for the electrostatic puck 22. The pedestal housing 34 can comprise a metal that is resistant to corrosion in the substrate processing environment, such as for example, at least one of stainless steel and titanium. The pedestal 32 can also comprise a pedestal column 33 that extends between the housing 34 and the chamber 106. Electrical connectors, gas conduits and fluid conduits can be passed through the column 33 to protect them from the processing environment. A bellows assembly 36 can also be provided to raise and lower the electrostatic puck 22 and substrate 104 in the chamber 106.

The electrostatic chuck 20 further comprises a base plate 42 below the electrostatic puck 22 that connects the electrostatic puck 22 to the pedestal 32. The base plate 42 comprises a disc-like main portion 43 underneath the ceramic body 26, and an annular flange 46 that extends outwardly from the main portion 43 along the ledge 40 of the pedestal 32. The annular flange 46 extends beyond the periphery 48 of the ceramic body 26 to provide an exposed portion of the base plate that is not covered by the ceramic body 26, and that can be attached directly to the pedestal 32. To connect the base plate 42 to the pedestal 32, the annular flange 46 comprises a plurality of holes 50 that are sized and shaped to allow a connector 44 to pass therethrough to connect to the pedestal ledge 40. For example, the holes 50 may extend vertically through a thickness of the annular flange 46, from a flange upper surface 41 to a flange lower surface 51. The holes 50 can also extend through at least a portion of the pedestal ledge 40 to secure the flange 46 to the ledge 40. A connector 44 suitable to connect the base plate 42 to the ledge 40 via the holes 50 can comprise, for example, at least one of a pin, bracket, bolt, screw, nail, and other similar object. For example, the connector 44 may comprise a threaded pin having a head 45 that is held on the top surface 41 of the annular flange 46, and a threaded lower end 47 that fits with a threaded hole 50 formed in the ledge 40 to secure the base plate 42 and pedestal 32 together.

The base plate 42 desirably comprises a material that is sufficiently strong to allow it to be secured to the pedestal 32 via the holes 50 substantially without cracking or breaking. In one version, the base plate 42 comprises a material that is a composite of a ceramic material and a metal. The composite material provides improved strength and durability over ceramic materials alone, such as AlN, and also has good heat transfer properties for the transfer of heat to and from the ceramic body 26 and substrate 104. The composite material also comprises a thermal expansion coefficient that is well matched to the ceramic body 26 to reduce thermal expansion mismatch between the ceramic body 26 and base plate 42. In one version, the composite material comprises a ceramic material having pores that are infiltrated with a metal. The infiltrated metal at least partially fills the pores in the ceramic to form a composite material that has characteristics of both the ceramic and the metal, to provide improved material strength substantially without sacrificing good thermal matching properties. The ceramic material may comprise, for example, at least one of silicon carbide, aluminum nitride, aluminum oxide and cordierite, and preferably silicon carbide. The ceramic material may comprise a pore volume without the infiltrated metal of from about 20 to about 80 volume percent of the total ceramic volume. The infiltrated metal can comprise one or a mixture of aluminum, silicon, and copper, and preferably comprises aluminum. The infiltrated metal may comprise a volume percent of from about 20% to about 80% of the total composite material. In another version, the composite material may comprise a different composition of a ceramic and metal, such as a composite comprising a metal having ceramic particles dispersed therein.

In one version, the base plate 42 can be attached to the ceramic body 26 of the electrostatic puck 22 by a bond layer 54. In one version, the bond layer 54 comprises a suitable brazing material that is formed between a top surface 49 of the base plate 42 and a bottom surface 25 of the ceramic body 26. The base plate 42, bond layer 54 and ceramic body 26 are then heated to a sufficiently high temperature and under a sufficiently high pressure such that the bond layer brazing material diffuses into both the base plate 42 and ceramic body 26 to form a bond between the materials. The bond layer 54 desirably comprises a material that has thermal properties suitably matched to the ceramic body 26 and base plate 42. For example, the bond layer 54 can comprise a metal material such as aluminum.

The electrostatic chuck 20 having the base plate 42 comprising the composite material and having the annular flange 46 is an improvement over conventional substrate supports because the electrostatic chuck 20 allows for the electrostatic puck 22 and base plate 42 to be easily removed from the pedestal 32 when replacement or refurbishment of one or more of the electrostatic puck 22 and base plate 42 is required. Because the exposed annular flange portion of the base plate 42 is not covered by the relatively brittle ceramic body 26, the relatively strong composite material of the annular flange 46 can be detachably directly connected to the pedestal 32 to allow for easy removal of the puck 22 and base plate 42. For example, the electrostatic puck 22 and base plate 20 can be detachably connected to the pedestal 32 by inserting the connector 44 through the composite material of the flange 46 and into the pedestal 32. The puck 22 and base plate 42 can then be removed from the pedestal 32 by removing the connector 44 from at least one of the base plate flange 46 and pedestal ledge 40, when one or more of the puck 22 and base plate 42 has become excessively eroded or dirtied with process residues.

The detachable electrostatic chuck 20 reduces the costs associated with processing substrates with the chuck 20 by allowing the electrostatic puck 22 and/or base plate 42 to be replaced or refurbished as needed, without requiring replacement of the entire chuck 20. The base plate 42 having the annular flange 46 provides significant advantages in allowing the electrostatic chuck 20 to be directly attached to, while still easily removable from, the chamber 106. The base plate 42 and annular flange 46 can also be made from a material that is more ductile than the ceramic material of the electrostatic puck 22, to reduce the effect of thermal expansion mismatches between the chuck 20 and the underlying pedestal 32. Also, because the annular flange 46 extends outwardly from the base plate 42, an operator can more easily see and access the bolts positioned on the annular flange 46, allowing the operator to more easily remove the chuck 20 from the chamber 106 when it requires cleaning, servicing, or refurbishment. In the prior art, the chuck 20 was joined to the pedestal 32 by a bond or metal braze so that the entire assembly including the pedestal 32 had to be removed from the chamber 106. Also, it was more difficult to reach down to the bottom of the chamber to access the underlying attachment components to remove the entire assembly. Removal of the entire prior art assembly from the chamber 106 can also result in possibly increased contamination of the larger surface or volume of components outside the chamber 106. In contrast, the present chuck 20 provides easier removal access, reduced thermal expansion mismatch stresses, and a smaller volume of components to remove from the chamber 106.

The electrostatic chuck 20 can further comprise other elements that improve substrate processing, such as for example, a thermocouple 80 having a temperature sensing end that is embedded in the electrostatic puck 22. The thermocouple 80 can connect to a temperature monitor, such as a chamber controller 194, to monitor the temperature of the chuck 20 and substrate 104 during processing. The electrostatic chuck 20 can also comprise heat transfer gas outlets 76 on the surface 28 of the electrostatic puck 22 to deliver a heat transfer gas, such as nitrogen, to the backside of a substrate 104. The heat transfer gas outlets 76 can feed channels (not shown) formed on the support surface 28, and can be connected via a conduit 74 to a heat transfer gas supply 75. A gas tube 72 can be inserted into the electrostatic puck 22 to define a path for the heat transfer gas through the puck 22, and to provide a desired flow of the heat transfer gas to the support surface 28.

In one version, the electrostatic chuck 20 further comprises a heat transfer plate 56 capable of transferring heat to or from the electrostatic puck 22 and substrate 104 to provide desired substrate processing temperature conditions. For example, the heat transfer plate 56 may comprise a cooling plate to cool the substrate 104 to a desired temperature, or to maintain a desired substrate temperature during processing. The heat transfer plate 56 can comprise at least one fluid channel 58 through which a heat transfer fluid can be flowed to control the temperature of the heat transfer plate 56. The heat transfer fluid is supplied by a fluid supply 57 connected to the fluid channel 58 via one or more conduits 61 that can be routed through the column 33 of the pedestal 32. The heat exchange plate 56 desirably extends beneath a substantial portion of the substrate receiving surface 28, such as for example from at least about 25% to about 85% of the substrate receiving surface 28, to provide good heat exchange with the substrate 104. The heat transfer plate 56 can be made of a thermally conductive material such as a metal, for example, at least one of copper, stainless steel and aluminum.

Figure 2:
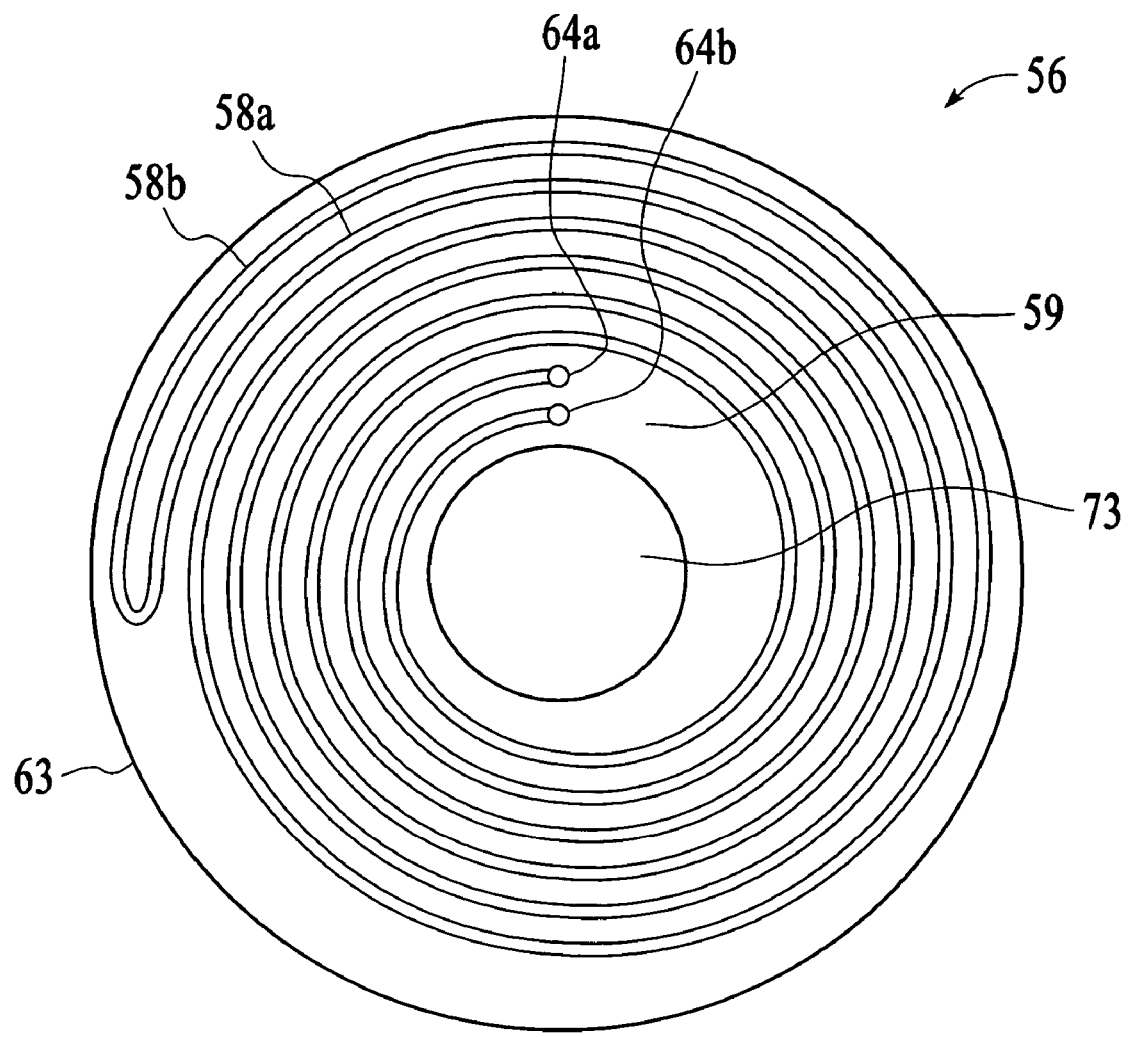
FIG. 2 is a sectional top view of an embodiment of a heat transfer plate having a heat transfer fluid channel.

In one version, the heat transfer plate 56 comprises improved fluid channels 58 that provide enhanced cooling/heating of the heat transfer plate 56. In the version shown in FIG. 2, the fluid channels 58 are embedded in the heat transfer plate to provide improved heating/cooling of the plate 56. The fluid channels 58 comprise a fluid inlet 64a that is located at an interior region 59 towards the center 73 of the plate 56, and that receives the heat transfer fluid from the connecting conduit 61. The fluid inlet 64a feeds a first spiral channel 58a that spirals outwardly from the fluid inlet 64a towards a periphery 63 of the heat transfer plate 56. The first spiral channel 58a desirably encircles the interior region 59 and center 73 more than once, such as at least about 3 times. A second spiral channel 58b connects to the first spiral channel 58a near the periphery of the plate 56, and runs adjacent to the first spiral channel 58a to trace a second spiraling flow path back to a fluid outlet 64b that is towards the center 73 of the plate 56. Thus, the spiral channels 58a,b provide opposing spiral flows of the heat transfer fluid through the heat transfer plate 56. The spiral channels 58a,b also provide a substantially horizontal flow of fluid through the heat transfer plate 56 to extend to a larger region of the plate 56. The improved fluid flow channel configuration provides improved temperature control of the heat transfer plate 56 by thermally contacting a large area of the heat transfer plate 56.

In one version, the heat transfer plate 56 is formed by attaching first and second plate portions 71a,b. For example, the heat transfer plate 56 may comprise a first plate portion 71a comprising a first material, and a second plate portion 71b below the first plate portion 71a that comprises a second material. The first plate portion 71a may comprise a first material having good heat transfer qualities to transfer heat to the substrate 104, such as for example copper. The second plate portion 71b may comprise other beneficial characteristics, for example, the second plate part 71b may be a material that comprises a high strength, such as stainless steel. The first and second plate portions 71a,b can be joined together by a conventional bonding method, for example by heating the plate portions 71a,b to braze the portions together. The fluid flow channel 58 is desirably embedded in one or more of the plate portions 71b, and is preferably at least partially embedded in the first plate portion 71a. In one version, the fluid flow channel 58 is formed by machining or otherwise forming an open channel in the first plate portion 71a, and brazing the second plate portion 71b over the open channel to form the closed fluid flow channel 58.

A thermally conductive layer 60 can be provided between the base plate 42 and the heat transfer plate 56 to enhance heat exchange therebetween. The thermally conductive layer 60 conforms to the top surface 65 of the heat transfer plate 56 and the bottom surface 67 of the base plate 42. In one version, the thermally conductive layer 60 comprises an interstitial material layer such as graphite, as described for example in U.S. Pat. No. 6,563,686 to Tsai et al, filed on Mar. 19, 2001, and commonly assigned to Applied Materials, which is herein incorporated by reference in its entirety.

In one version, the electrostatic chuck 20 can further comprise a spring assembly 62 adapted to apply a pressure to the heat transfer plate 56 to press the plate 56 against the base plate 42 and improve heat transfer therebetween. In the version shown in FIG. 1, the spring assembly 62 comprises a plurality of vertically aligned springs 23 that are compressed between a bottom wall 66 of the pedestal housing 34 and the heat transfer plate 56. The springs 23 can be positioned at intervals along the bottom wall 66 to form one or more annular groupings of springs that apply pressure about a desired radius of the heat transfer plate 56. The spring assembly 62 can further comprise a compression ring 68 that rests on top of the springs 23 and has a pressing surface 69 that presses against the heat transfer plate 56. The spring assembly 62 desirably applies a force of from at least about 890 N (200 lbs) to about 1780 N (400 lbs) to the heat transfer plate 56 to improve heat transfer with the base plate 42 and electrostatic puck 22.

The electrostatic chuck 20 may also comprise springs in other areas of the assembly where it is desirable to apply pressure. For example, the electrostatic chuck 20 may comprise a plurality of gas tube springs 70 to support and stabilize the gas tube 72 in the portion of the gas conduit 74 formed in the electrostatic puck 22 and base plate 42. A plurality of springs 70 can be positioned on top of the heat transfer plate 56 and press on a lower surface 78 of the gas tube 72 to secure the gas tube in the gas conduit 74. The springs 70 help stabilize the gas tube 72 during varying process temperatures and process conditions that could otherwise lead to misalignment of the gas tube 72.

An embodiment of an apparatus 102 comprising a process chamber 106 suitable for processing a substrate 104 with the electrostatic chuck 20 is shown in FIG. 3. The particular embodiment of the apparatus 102 shown herein is suitable for processing substrates 104 such as semiconductor wafers, and may be adapted by those of ordinary skill to process other substrates 104, such as flat panel displays, polymer panels, or other electrical circuit receiving structures. The apparatus 102 is particularly useful for processing layers, such as etch resistant, silicon-containing, metal-containing, dielectric, and/or conductor layers on the substrate 104. The apparatus 102 may also be attached to a mainframe unit (not shown) that contains and provides electrical, plumbing, and other support functions for the apparatus 102 and may be part of a multi-chamber system (not shown).

Generally, the process chamber 106 comprises a wall 107, such as an enclosure wall 103, which may comprise a ceiling 118, sidewalls 114, and a bottom wall 116 that enclose a process zone 108. In operation, process gas is introduced into the chamber 106 through a gas supply 130 that includes a process gas source 138, and a gas distributor 137. The gas distributor 137 may comprise one or more conduits 136 having one or more gas flow valves 134 and one or more gas outlets 142 around a periphery of the substrate 104, which is held in the process zone 108 on the electrostatic chuck 20. Alternatively, the gas distributor 130 may comprise a showerhead gas distributor (not shown). Spent process gas and process byproducts are exhausted from the chamber 106 through an exhaust 144 which may include an exhaust port 170 that receives spent process gas from the process zone 108 and delivers the gas to an exhaust conduit 177, a throttle valve 135 to control the pressure of process gas in the chamber 106, and one or more exhaust pumps 152.

The process gas may be energized to process the substrate 104 by a gas energizer 154 that couples energy to the process gas in the process zone 108 of the chamber 106. For example, the gas energizer 154 may comprises process electrodes, that may be powered by a power supply to energize the process gas. The process electrodes may include an electrode that is or is in a wall, such as a sidewall 114 or ceiling 118 of the chamber 106, that may be capacitively coupled to another electrode, such as the electrode 24 in the electrostatic chuck 20 below the substrate 104. Alternatively or additionally, the gas energizer 154 may comprise an antenna comprising one or more inductor coils which may have a circular symmetry about the center of the chamber 106. In yet another version, the gas energizer 154 may comprise a microwave source and waveguide to activate the process gas by microwave energy in a remote zone (not shown) upstream from the chamber 106.

In one version, the chamber 106 can comprise a physical vapor deposition chamber capable of sputter depositing material on a substrate 104. In this version, the chamber comprises a sputtering target 155 having material to be deposited on the substrate. The target 155 can be electrically biased with respect to another component in the chamber, such as a process shield, to act as a part of a gas energizer 154 that energizes the process gas and sputters material from the target 155 and onto the substrate 104.

To process a substrate 104, the process chamber 106 is evacuated and maintained at a predetermined sub-atmospheric pressure. The substrate 104 is then provided on the electrostatic chuck 20 by a substrate transport 101, such as for example a robot arm and a lift pin system. The gas supply 130 provides a process gas to the chamber 106 and the gas energizer 154 couples energy to the process gas to energize the gas and process the substrate 104, for example by etching material on the substrate or depositing material on the substrate 104. Similarly, to clean the chamber after processing of the substrate 104, the gas supply 130 provides a process gas comprising a cleaning gas to the chamber 106 and the gas energizer 154 energizes the cleaning gas to clean the chamber 106.

The chamber 106 is controlled by a controller 194 that comprises program code having instruction sets to operate components of the chamber 106 to process substrates 104 in the chamber 106. For example, the controller 194 can comprise a substrate positioning instruction set to operate one or more of the electrostatic chuck 20 and substrate transport to position a substrate 104 in the chamber 106, and to set a chucking voltage applied by the electrode power supply 81 to hold the substrate 104 on the electrostatic chuck 20; a gas flow control instruction set to operate the flow control valves 134 to set a flow of gas to the chamber 106; a gas pressure control instruction set to operate the exhaust throttle valve 135 to maintain a pressure in the chamber 106; a gas energizer control instruction set to operate the gas energizer 154 to set a gas energizing power level; a temperature control instruction set to control temperatures in the chamber 106, for example by controlling the supply of heat transfer fluid to the heat transfer plate 56, and the supply of heat transfer gas to the support surface 28; and a process monitoring instruction set to monitor the process in the chamber 106, for example by monitoring temperatures via the thermocouple 80.

Although exemplary embodiments of the present invention are shown and described, those of ordinary skill in the art may devise other embodiments which incorporate the present invention, and which are also within the scope of the present invention. For example, the annular flange 46 may be connected to the ledge 40 of the pedestal by means other than those specifically described. Furthermore, relative or positional terms shown with respect to the exemplary embodiments are interchangeable. Therefore, the appended claims should not be limited to the descriptions of the preferred versions, materials, or spatial arrangements described herein to illustrate the invention.

What is claimed is:

1. A detachable electrostatic chuck capable of attachment to a pedestal in a process chamber, the chuck comprising:

(a) an electrostatic puck comprising a ceramic body with an embedded electrode, the ceramic body having a substrate support surface with an annular periphery; and
(b) a base plate bonded to the electrostatic puck by a bond layer, the base plate having an annular flange extending beyond the periphery of the ceramic body, the annular flange comprising a plurality of holes to allow connectors to pass therethrough, and wherein the base plate comprises a composite of a ceramic material comprising pores that are at least partially filled by a metal.

2. A chuck according to claim 1 wherein in (b) the ceramic material comprises silicon carbide and the metal comprises aluminum.

3. A chuck according to claim 2 wherein the volume percentage of aluminum in the composite is from about 20% to about 80%.

4. An electrostatic chuck assembly comprising:
(a) a detachable electrostatic chuck comprising:
   (i) an electrostatic puck comprising a ceramic body with an embedded electrode, the ceramic body having a substrate support surface and an annular periphery; and
   (ii) a base plate bonded to the electrostatic puck by a bond layer, the base plate having an annular flange extending beyond the annular periphery of the ceramic body, the annular flange comprising a plurality of holes that are shaped and sized to allow connectors to pass therethrough, wherein the base plate comprises a composite comprising a ceramic material comprising pores that are at least partially infiltrated with a metal; and
(b) a support pedestal having a housing and an annular ledge, the annular ledge extending outwardly from the housing, wherein the annular ledge is capable of being attached to the annular flange of the base plate by the connectors.

5. A chuck assembly according to claim 4 wherein the ceramic material comprises silicon carbide and the metal comprises aluminum.

6. A chuck assembly according to claim 4 further comprising a heat transfer plate below the base plate, the heat transfer plate having a heat transfer fluid channel embedded therein.

7. A chuck assembly according to claim 6 wherein the heat transfer plate comprises an upper portion comprising a first material and a lower portion comprising a second material, and the heat transfer fluid channel being embedded therebetween.

8. A chuck according to claim 7 wherein the first material comprises copper and the second material comprises stainless steel.

9. A chuck assembly according to claim 6 further comprising a spring assembly to apply a pressure to the heat transfer plate.

10. A chuck assembly according to claim 6 further comprising a thermally conductive layer between the heat transfer plate and base plate.

11. A chuck assembly according to claim 4 wherein the bond layer comprises an aluminum bond layer.

12. A substrate processing chamber comprising the electrostatic chuck of claim 4 and further comprising a gas supply to provide a process gas in the chamber, a gas energizer to energize the gas, and an exhaust to exhaust the gas.

13. An electrostatic chuck assembly comprising:
(a) a detachable electrostatic chuck comprising:
   (i) an electrostatic puck comprising a ceramic body with an embedded electrode, the ceramic body having a substrate support surface and an annular periphery; and
   (ii) a base plate bonded to the electrostatic puck by a bond layer, the base plate having an annular flange extending beyond the annular periphery of the ceramic body, the annular flange comprising a plurality of holes that are shaped and sized to allow connectors to pass therethrough, and the base plate comprising a composite comprising a ceramic material infiltrated with a metal;
(b) a support pedestal having a housing and an annular ledge, the annular ledge extending outwardly from the housing, the annular ledge being capable of being attached to the annular flange of the base by the connectors; and
(c) a heat transfer plate below the base plate, the heat transfer plate having a heat transfer fluid channel comprising first and second spiral channels, the first spiral channel being adapted to provide a flow of fluid therethrough that is substantially opposite a flow of fluid through the second spiral channel.

14. A chuck assembly according to claim 13 wherein at least one of the first and second spiral channels encircles a center of the heat transfer plate 3 times.

15. A chuck assembly according to claim 13 further comprising a spring assembly to apply a pressure to the heat transfer plate.

16. A chuck assembly according to claim 13 further comprising a thermally conductive layer between the heat transfer plate and the base plate.

17. A chuck assembly according to claim 13 wherein the bond layer comprises an aluminum bond layer.

18. An electrostatic chuck assembly comprising:
(a) a detachable electrostatic chuck comprising:
   (i) an electrostatic puck comprising a ceramic body with an embedded electrode, the ceramic body having a substrate support surface and an annular periphery; and
   (ii) a base plate bonded to the electrostatic puck by a bond layer, the base plate having an annular flange extending beyond the periphery of the ceramic body, the annular flange comprising a plurality of holes to allow connectors to pass therethrough, and wherein the base plate comprises a composite of a ceramic material comprising pores that are at least partially filled by a metal;
(b) a support pedestal having a housing and an annular ledge, wherein the annular ledge extends outwardly from the housing to attach to the annular flange of the base plate, thereby supporting the base plate and electrostatic puck;
(c) a heat transfer plate below the base plate and at least partially surrounded by the pedestal housing, the heat transfer plate comprising an embedded heat transfer fluid channel; and
(d) a spring assembly at least partially surrounded by the pedestal housing, the spring assembly being biased to press the heat transfer plate against the base plate.

19. A chuck assembly according to claim 5 wherein the volume percentage of aluminum in the composite is from about 20% to about 80%.

* * * * *

UNITED STATES PATENT AND TRADEMARK OFFICE
CERTIFICATE OF CORRECTION

PATENT NO. : 7,697,260 B2
APPLICATION NO. : 10/816152
DATED : April 13, 2010
INVENTOR(S) : Brown et al.

It is certified that error appears in the above-identified patent and that said Letters Patent is hereby corrected as shown below:

Column 4, line 16 the text "AIN" should read --AlN-- to indicate Aluminum Nitride.

Column 9, line 48 cancel the text beginning with "8. A chuck according to" and ending with "stainless steel." in column 9, line 50 and insert the following claim:

--8. A chuck assembly according to claim 7 wherein the first material comprises copper and the second material comprises stainless steel.--

Column 9, line 59 cancel the text beginning with "12. A substrate processing chamber" and ending with "exhaust the gas." in column 9, line 62 and insert the following claim:

--12. A substrate processing chamber comprising the electrostatic chuck assembly of claim 4 and further comprising a gas supply to provide a process gas in the chamber, a gas energizer to energize the gas, and an exhaust to exhaust the gas.--

Signed and Sealed this

Twenty-seventh Day of July, 2010

David J. Kappos
*Director of the United States Patent and Trademark Office*